United States Patent [19]
Lin et al.

[11] Patent Number: 5,922,059
[45] Date of Patent: Jul. 13, 1999

[54] CIRCUIT BOARD CONNECTOR

[75] Inventors: Yu-Zong Lin, Fountain Valley; Chao-Wen Liu, Anaheim, both of Calif.

[73] Assignee: CSS Labs, Inc., Irvine, Calif.

[21] Appl. No.: 08/818,751

[22] Filed: Mar. 14, 1997

[51] Int. Cl.⁶ .................................................. G06F 13/00
[52] U.S. Cl. .................. 710/100; 710/102; 439/101; 361/686
[58] Field of Search .................................. 439/59, 60, 61, 439/62, 101, 497; 361/686; 710/100, 101, 102

[56] References Cited

U.S. PATENT DOCUMENTS

| | | | |
|---|---|---|---|
| 4,917,616 | 4/1990 | Demler, Jr. et al. | 439/101 |
| 5,277,591 | 1/1994 | Felcman et al. | 439/60 |
| 5,481,432 | 1/1996 | Tsukada et al. | 361/686 |
| 5,502,617 | 3/1996 | Tsukada et al. | 361/686 |
| 5,584,706 | 12/1996 | Hung | 439/64 |
| 5,710,733 | 1/1998 | Chengson et al. | 365/52 |
| 5,742,178 | 4/1998 | Jenkins, IV et al. | 326/33 |

OTHER PUBLICATIONS

MaxPro product brochure, CSS Laboratories, Inc., 1997.
ProRACK product brochure, CSS Laboratories, Inc., 1997.

*Primary Examiner*—Ayaz R. Sheikh
*Assistant Examiner*—Xuong Chung-Trans
*Attorney, Agent, or Firm*—Fitzpatrick, Cella, Harper & Scinto

[57] ABSTRACT

A connector for a circuit board has a pins that are compatible with a standard ISA connector. The connector includes at least 38 pins connected to a ground potential, at least 23 pins connected to a VCC potential, and a plurality of bus select pins, through which the circuit board can select a particular bus. Over the selected bus, communications are transmitted to and from the circuit board.

10 Claims, 6 Drawing Sheets

CIRCUIT BOARD CONNECTOR

BACKGROUND OF THE INVENTION

1. Field of the Invention

The present invention relates to a circuit board connector for interfacing between a passive backplane or motherboard and a circuit board mated to the backplane or motherboard. More specifically, the present invention is a circuit board connector which reduces the ground potential difference between a circuit board, such as a single board computer (hereinafter "SBC"), and a passive backplane, by defining a number of pins which are grounded and a number of pins which are connected to VCC. The circuit board connector also includes bus select pins which permit the circuit board to select a particular bus, such as a PCI bus, connected to the backplane.

2. Description of the Related Art

Conventionally, SBCs are connected to passive backplanes via industry standard architecture (hereinafter "ISA") connectors. Problems arise with such an arrangement, however, due to a ground potential difference which exists between the ground on the SBC and the ground on the passive backplane.

More specifically, the ground potential difference noted above adversely affects data transmissions between the SBC and the passive backplane. For example, the ground potential difference can cause noise, bit drop-out (i.e., loss of bits), and spurious bits to appear in a data transmission. These problems become worse as the number of connectors on the passive backplane and the processing speed of the SBC increase, and even become more acute when the number of connectors is greater than 10 and/or the processing speed of the SBC is greater than 100 MHz.

Problems similar to those described above occur in slimline or low profile chassis computers, in which circuit boards are connected to a motherboard via a riser card. In such cases, as in the case of the passive backplane described above, a ground potential difference exists between the circuit boards and the motherboard, which can adversely affect data transmitted therebetween.

In some high data throughput applications, data corruption resulting from a ground potential difference can be tolerated. However, such data corruption is not desired in cases where data integrity is essential, such as in processing auditory signals through, e.g., text-to-speech applications or interactive voice response cards. For example, in the case of text-to-speech processing, bit drop-out, spurious bits, and noise can cause speech generated from processed data to be unrecognizable.

Heretofore, there has been no way of alleviating the foregoing problem in a cost-effective manner, since the ground potential difference described above was a direct result of the limited number of pins on an ISA connector. That is, standard ISA connectors include only three VCC pins, four ground pins, and a limited number of unassigned pins. Even if all the unassigned pins in a standard ISA connector were re-assigned to VCC and ground, it has been determined that it would still be insufficient to reduce the ground potential difference noted above enough to alleviate data drop-out, spurious bits, and noise, especially in cases where the SBC has a processing speed in excess of 100 MHz and/or the number of connectors on the passive backplane exceeds 10.

In addition to the foregoing problems related to the ground potential difference, conventional ISA connector/passive backplane arrangements also make it difficult for an SBC to select a bus on the backplane, over which to transmit data. That is, since a standard bus connector includes only two non-assigned pins, in cases where more than two buses are connected to a backplane (e.g., four buses), it was necessary to add physical components, such as jumpers, between bus connectors so as to allow the SBC to select a particular bus. These physical components reduced the amount of space available on the backplane and increased production costs.

Thus, there exists a need for a circuit board connector which provides (1) additional VCC and ground pins so as to reduce a ground potential difference between a backplane (or motherboard as the case may be) and a circuit board installed on the backplane, and (2) bus select pins for selecting a bus connector/bus, without the need for additional physical components, such as jumpers.

SUMMARY OF THE INVENTION

The present invention addresses the foregoing needs by providing a connector for a circuit board, which has pins that are compatible with a standard ISA connector. Specifically, the connector has more pins than an ISA connector, preferably twice as many. In this regard, the pins on the top half of the connector are compatible with a standard ISA connector so as to maintain signal integrity, and some of the pins on the bottom half of the connector are assigned to VCC and some to ground.

By assigning some of the pins of the foregoing connector to ground and some to VCC, the present invention is able to reduce the ground potential difference between an SBC (or other type of circuit board) on which the connector is mounted and a passive backplane (or motherboard) to which the connector mates. In some cases, the ground potential difference can be reduced to substantially zero. In fact, such a reduction has been found to be possible even in cases where 20 connectors are driven on a backplane and the SBC includes a processor that operates at speeds over 200 MHz.

In addition, in the connector of the present invention, some of the pins on its bottom half are assigned as bus select pins. These bus select pins are used by the SBC to select a bus on the passive backplane, over which communications are transmitted between the SBC and other peripheral boards or external devices. These bus select pins alleviate the need for jumpers or other physical components to select a particular bus.

Thus, according to one aspect, the present invention is a connector for a circuit board. The connector has a pin configuration which is compatible with a standard ISA connector, and includes at least 38 pins connected to a ground potential, at least 23 pins connected to a VCC potential, and a plurality of bus select pins. The plural bus select pins are used by the circuit board to select a bus, over which communications are transmitted to and from the circuit board.

By including at least 38 pins connected to ground and at least 23 pins connected to VCC, the connector of the present invention is able to reduce a ground potential difference between a circuit board on which half of the connector is mounted and a passive back plane on which the other half of the connector is mounted. As a result, the problems of bit drop-out, spurious bits, and noise can be reduced by the invention. The bus select pins provide the advantages mentioned above.

According to another aspect, the present invention is a passive backplane having connectors which mate to connectors of plural circuit boards. The passive backplane includes one or more bus connectors thereon for connecting to buses over which communications are transmitted. The passive backplane also includes an SBC connector having plural pins, of which at least 38 of the plural pins are connected to a ground potential, and at least 23 of the plural pins are connected to a VCC potential when a connector on an SBC is mated to the SBC connector on the passive backplane.

In preferred embodiments of the invention, the at least 23 pins connected to the VCC potential and the at least 38 pins connected to the ground potential reduce, to substantially zero, a ground potential difference between the passive backplane and the SBC. By reducing the ground potential difference between the passive backplane and the SBC to substantially zero, the invention is able to reduce the problems of bit drop-out, spurious bits, and noise even further.

In particularly preferred embodiments of the invention, the SBC connector has a pin configuration which is compatible with a standard ISA connector. Consequently, it can be mated with an ISA-compatible connector and, therefore, does not require any special physical adapters or the like.

In still other preferred embodiments, the passive backplane includes two or more bus connectors corresponding to respective buses. One of the bus connectors is associated with the SBC connector, and buses corresponding to the one bus connector connect to buses corresponding to others of the bus connectors. In these cases, the SBC connector includes one or more bus select pins which corresponds to the others of the bus connectors, and the passive backplane includes electrical connections between the one or more bus select pins and each corresponding other bus connector. By virtue of this arrangement, a particular bus can be selected using the bus select pins, thereby reducing the need for physical components, even in cases where more than two active buses are connected to the passive backplane.

According to another aspect, the present invention is a network file server which manages data received from a peripheral using a single board computer. The network file server includes a network interface, over which data is transmitted to and received from a network, and a passive backplane. The passive backplane includes (1) a female board connector having a pin configuration which is compatible with a standard ISA connector, (2) one or more standard female ISA connectors, and (3) two or more bus connectors corresponding to buses over which data is transmitted. One or more circuit boards having standard male ISA connectors are mated to the standard female ISA connectors on the passive backplane, and a single board computer having a male board connector is mated to the female board connector on the passive backplane. The mated board connectors have plural pins, at least 38 of the plural pins being connected to a ground potential, and at least 23 of the plural pins being connected to a VCC potential. Finally, the single board computer drives the circuit boards in the passive backplane so as to manage data received over the network interface or from other sources and to transmit that data over the buses.

According to another aspect, the present invention is a connector having a male half on a circuit board and a female half on a passive backplane. The connector mates the circuit board to the passive backplane, and has a pin configuration which is compatible with a standard ISA connector. The connector includes between 14 and 38 pins connected to a ground potential, between 14 and 23 pins connected to a VCC potential, at least one pin connected to −5V, at least one pin connected to −12V, and at least two pins connected to +12V. Four bus select pins are provided on the connector, through which the circuit board can select a particular bus over which communications are transmitted to and from the circuit board.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION OF THE PREFERRED EMBODIMENTS

In brief, the present invention is a circuit board connector having a pin configuration which is compatible with a standard ISA connector, and having plural pins, at least 38 of which are connected to a ground potential, and at least 23 of which are connected to a VCC potential (e.g., +5 V). Also included in the invention are plural bus select pins, through which the circuit board can select a particular bus, over which communications are transmitted to and from the circuit board. The invention is preferably embodied in a computer telephony server or a network file server having an SBC for managing and/or processing data received from an external source.

Figure 1:
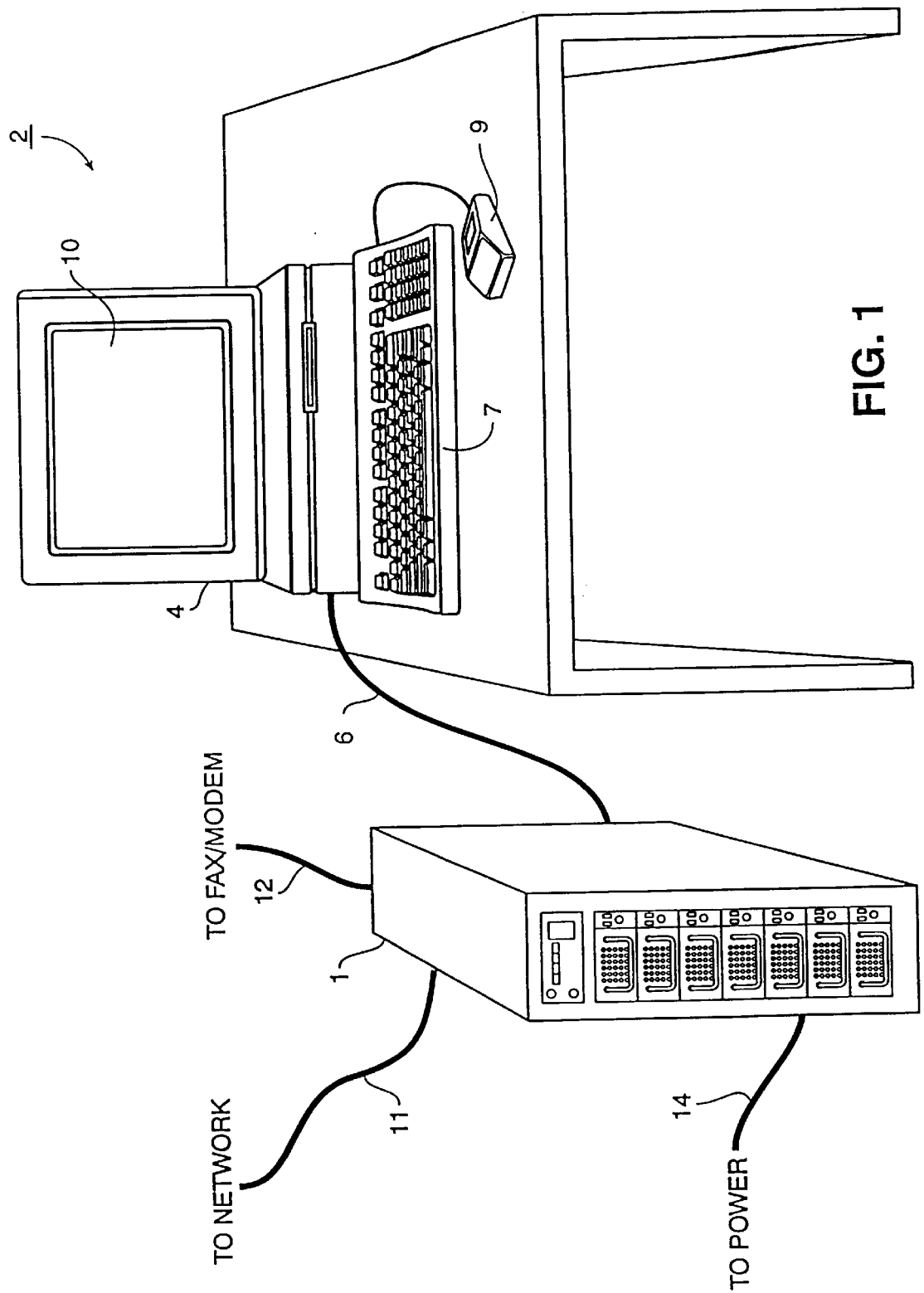
FIG. 1 is a view of computer hardware used in the present invention.

FIG. 1 is a view showing the outward appearance of such a network file server, labelled as reference numeral 1, and its associated computing equipment 2. Although file server 1 is in a tower configuration, other configurations, such as a rack configuration, may be used in the present invention. In preferred embodiments of the invention, file server 1 is a "MAXPro" series file server manufactured by CSS Laboratories, Inc. It should be noted, however, that the present invention may also be used in file servers (or other computer hardware for that matter) produced by other manufacturers.

In general, file server 1 acts as a centralized file storage device for PC workstations and network peripherals. In addition, in preferred embodiments, file server 1 may perform a variety of other computing functions, including, for example, conversion of text data to speech data. Functions of file server 1 are performed by one or more circuit boards installed in the file server in conjunction with at least one SBC also installed in the file server. The hardware configuration of file server 1 is described in more detail below.

Data can be received by file server 1 from a variety of sources. For example, file server 1 can receive data from PC 4 over computer interface 6. In this regard, PC 4, which can be a MacIntosh, an IBM PC-compatible computer, or the like, employs a variety of devices for inputting such data.

These devices include keyboard 7 for entering text data and user commands, and pointing device 9, such as a mouse, for pointing and for manipulating objects displayed on display screen 10. Data input through these devices may be processed, organized into files, and stored, via computer interface 6, to a particular storage area (e.g., a hard drive) on file server 1. File server 1 may also process received data, e.g., convert text data to speech data, and transmit the processed data to an external recipient.

In this regard, PC 4 may retrieve data stored in file server 1 via commands input from keyboard 7 or pointing device 9. The data retrieved from file server 1 by PC 4 may be displayed on display screen 10, processed further and re-stored to file server 1, or output to a connected or remote peripheral (not shown).

File server 1 can also receive data from a network via network interface 11. Thus, remote network PCs (not shown) can store and access data files in storage areas of file server 1 in the same manner as directly-connected PC 4. Through network interface 11, file server 1 can also provide shared printer services by receiving, storing, queuing and transmitting files to remote network printers or other types of peripherals (not shown). For example, print files created by remote network PCs (or by PC 4) can be routed to file server 1, which will store the print files and then transfer the print files upon command.

Data in file server 1 can also be received from, or accessed by, other sources via fax/modem interface 12. For example, images scanned-in by a facsimile machine (not shown) can be transmitted to and stored in a storage area on file server 1 via fax/modem interface 12. Such data may then be accessed by PC 4 or a remote network PC, sent to a remote network printer for printing, etc.

At this point, it should be noted that the foregoing is not meant to limit the sources from which file server 1 can receive data, and that data may be received by file server 1 from sources other than those described above. Likewise, devices other than those mentioned above can access data stored on file server 1. Power, however, is preferably provided to file server 1 from a single power source through power line 14, shown in FIG. 1.

Figure 2:
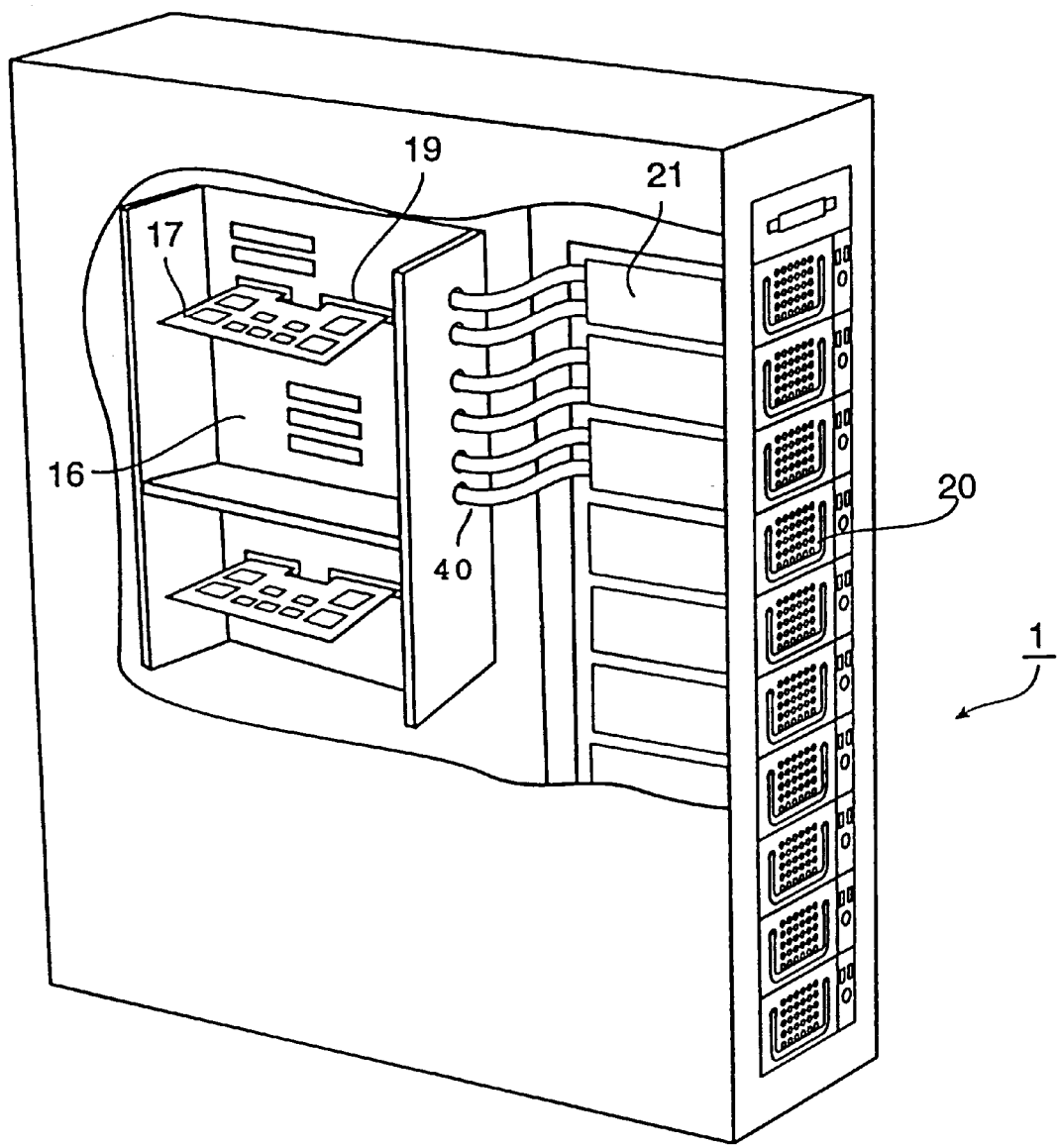
FIG. 2 is a cut-away perspective view of a file server including the connector of the present invention.

FIG. 2 shows a cut-away perspective view of file server 1. As shown in FIG. 2, file server 1 includes passive backplane 16, SBC 17 having SBC connector 19, and plural drive trays 20, which house mass storage devices 21. As shown in FIG. 2, passive backplane 16 is partitioned so as to include more than one SBC, in order to increase the amount of data which may be managed/processed. For the sake of brevity, however, only one partition including only one SBC will be described herein.

Figure 3:
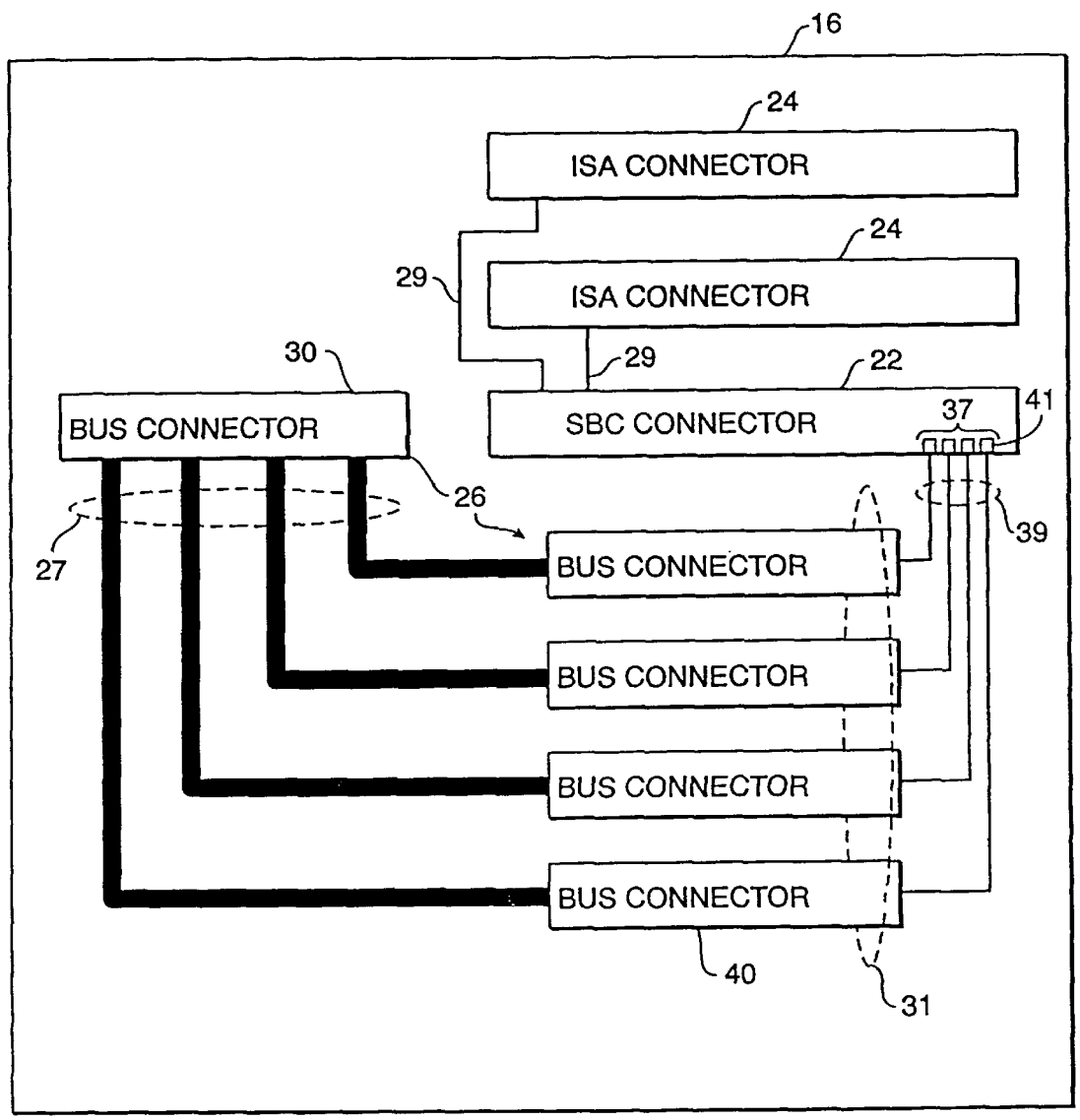
FIG. 3 shows a layout of a passive backplane for a file server which includes the connector of the present invention.

A representative embodiment of passive backplane 16 is shown in FIG. 3. As shown, passive backplane 16 includes various connectors, to which corresponding connectors on different types of circuit boards may be mated. For example a female connector may be provided on passive backplane and a male connector on a circuit board, or vice versa.

Among the connectors included on passive backplane 16 are SBC connector 22, ISA connectors 24, and bus connectors 26 (in preferred embodiments, bus connectors 26 are PCI bus connectors). Each of the connectors on passive backplane 16 is described in more detail below. Others connectors may also be provided on passive backplane 16 as needed or desired. For the sake of brevity, however, the present description is limited to the connectors shown in FIG. 3.

Passive backplane 16 also includes electrical connections, e.g., internal buses 27 between bus connectors 30 and 31 and internal wiring 29 and 39. These electrical connections run between ISA connectors 24, SBC connector 22, and bus connectors 26. It is through these electrical connections that circuit boards mated to passive backplane 16 communicate with each other and/or external devices. For example, internal wiring 39 between SBC connector 22 and bus connectors 31 is used by SBC 17 to select a bus for communication. This process is described in more detail below.

Passive backplane 16 also includes additional electrical circuitry (not shown), for altering signals transmitted over its electrical connections. Since this circuitry has no bearing on the present invention, its details are neither being provided herein, nor are being shown in the figures.

Regarding the connectors on passive backplane 16, SBC connector 22 has a pin configuration that corresponds to a standard ISA pin configuration. Although only one SBC connector is shown in FIG. 3, any number thereof may be included, depending upon the number of SBCs desired on a segmented passive backplane. In preferred embodiments of the invention, SBC connector 22 and its mating connector SBC connector 19 include plural pins, of which at least 38 of the plural pins are connected to a ground potential, and at least 23 of the plural pins are connected to a VCC potential when the two connectors are mated. Pin assignments for SBC connector 19/SBC connector 22 are described in more detail below.

Standard ISA connectors mate with ISA connectors 24, thus allowing additional circuit boards to be installed in file server 1. Such circuit boards could include, for example, integrated voice cards or the like, which convert received data into voice communication data for subsequent storage on, or transmittal from, file server 1. Any number of ISA connectors may be included on passive backplane 16, limited of course, by available space on the passive backplane and the processing ability of resident SBCS.

Bus connectors for, preferably external, buses mate with bus connectors 26, thereby providing access to those buses for circuit boards installed on passive backplane 16. Preferably, all buses used in file server 1 have a PCI architecture. Other bus architectures, however, may be used. In addition, any number of bus connectors may be included on passive backplane 16 depending, of course, on the number of buses desired and available space on the passive backplane.

As shown in FIG. 3, bus connector 30 is associated with SBC connector 22. As also shown, buses 27 corresponding to bus connector 30 connect to plural other buses via bus plural connectors 31. In preferred embodiments of the invention, buses 27 are internal to passive backplane 16, whereas the buses that correspond to bus connectors 31 are external to passive backplane 16 and are preferably made of ribbon cable (see, e.g., reference numeral 40 of FIG. 2). Through the connection between such internal and external buses, SBC 17 can transmit data to, and receive data from, circuit elements on passive backplane 16 and/or external devices (e.g., mass storage devices) in file server 1 or outside of file server In this regard, the storage areas of file server 1 noted above comprise mass storage devices. Mass storage devices 21, shown in FIG. 2, are preferably housed in plural drive trays 20. In preferred embodiments of the invention, drive trays 20 are removable so that the mass storage devices can be replaced easily, and are lockable so as to limit access to the mass storage devices. Some or all of these mass storage devices of file server 1 can be accessed by SBC 17 via the external buses (e.g., ribbon cable 40 shown in FIG. 2) connected to passive backplane 16 via bus connectors 31.

Figure 4:
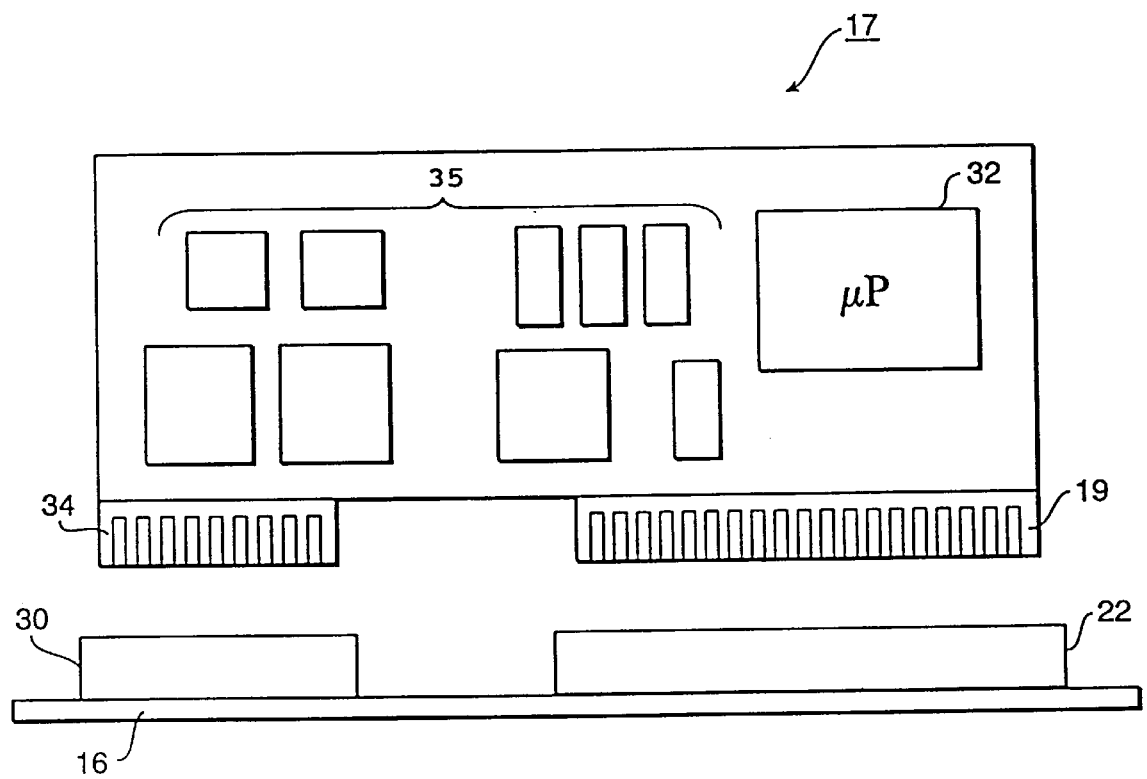
FIG. 4 is a side view of the connector of the present invention interfacing an SBC to a passive backplane.

FIG. 4 shows a side view of SBC 17 mating to passive backplane 16. As shown, SBC 17 includes microprocessor 32, as well as other circuitry 35, e.g., ROM, RAM, interfacing logic, etc., for receiving and/or processing data from peripherals either on or off a network, and for routing the data accordingly. In preferred embodiments of file server 1, microprocessor 32 comprises single or dual Pentium Pro processors which operate at speeds up to 266 MHz, and which are combined with a maximum of 512 KB Level 2 integrated cache. It should be noted, however, that other processors having different processing speeds may be used on SBC 17.

SBC 17 includes bus connector 34 which mates to bus connector 30 (i.e., the bus connector associated with SBC connector 22) on passive backplane 16. In preferred embodiments, bus connector 34 is a male, standard PCI bus connector, although other types of bus connectors may be used, depending upon the bus architecture used by file server 1. Likewise, preferably, bus connector 30 is preferably a female, standard PCI bus connector.

Figure 5:
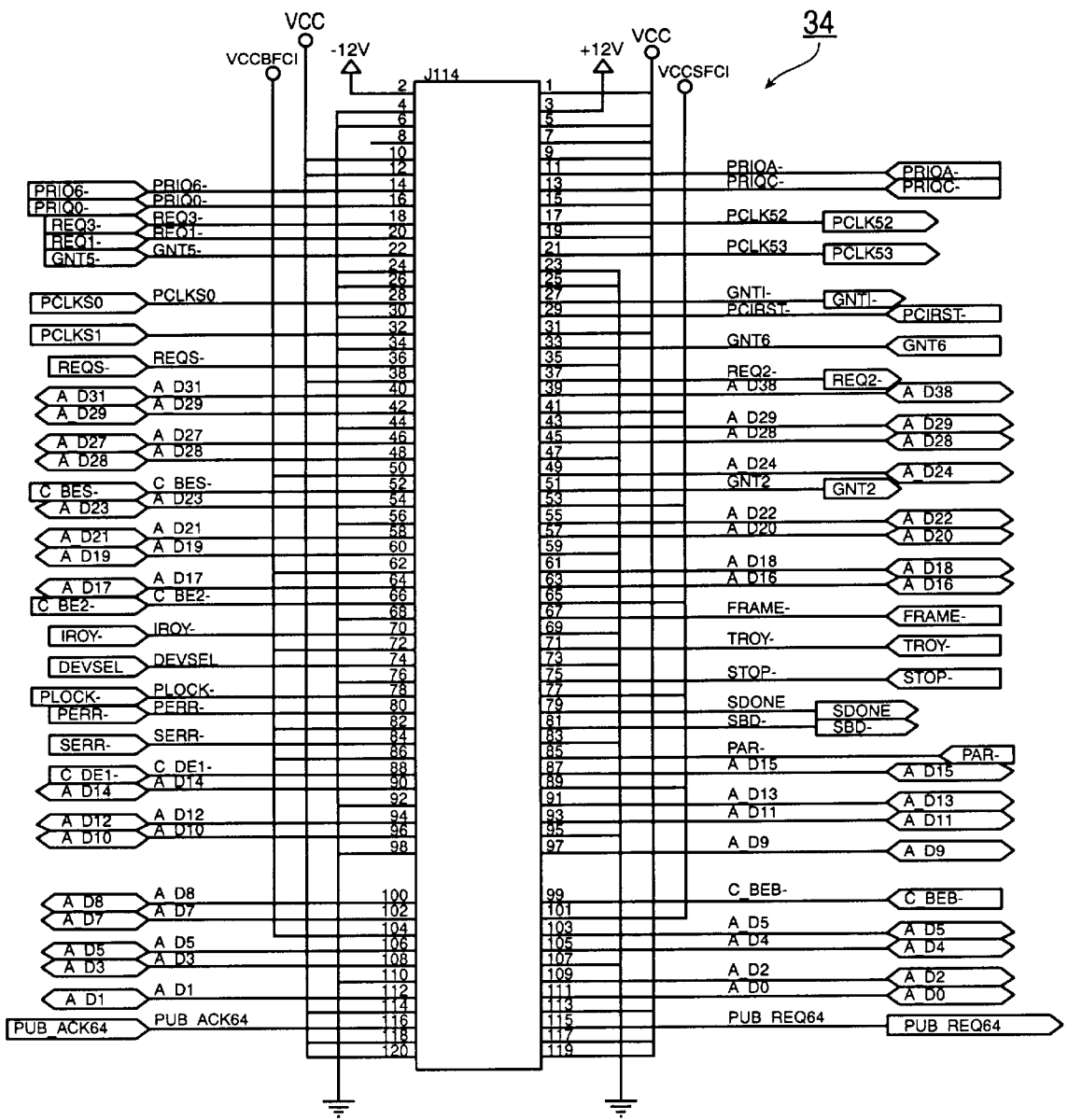
FIG. 5 shows pin assignments for the bus connector associated with the connector of the present invention.

Pin assignments for the preferred embodiment of bus connector 34 are shown in FIG. 5. These pin assignments correspond to standard pin assignments for a bus having PCI architecture. Since such pin assignments are well known to those of ordinary skill in the art, a detailed description thereof is omitted here for the sake of brevity. Suffice it to say that there are 64 pins on bus connector 34, which permit SBC 17 to exchange data over buses 27 (see FIG. 3) when bus connector 34 is mated to bus connector 30.

Returning to FIG. 4, SBC 17 also includes SBC connector 19, which is preferably a male connector that mates with SBC connector 22, which is preferably a female connector, on passive backplane 16. With regard to the pin configuration of SBC connector 19, SBC connector 19 has a pin configuration Which is compatible with that of a standard ISA connector. Thus, SBC connector 19 can mate to SBC connector 22 on passive backplane 16. This mating is depicted in FIG. 4. Through mated bus connector 34 and mated SBC connector.19, SBC 17 is able to transmit data through buses and other electrical connections on passive backplane 16 to other circuit boards and external devices either inside or outside of file server 1.

Figure 6:
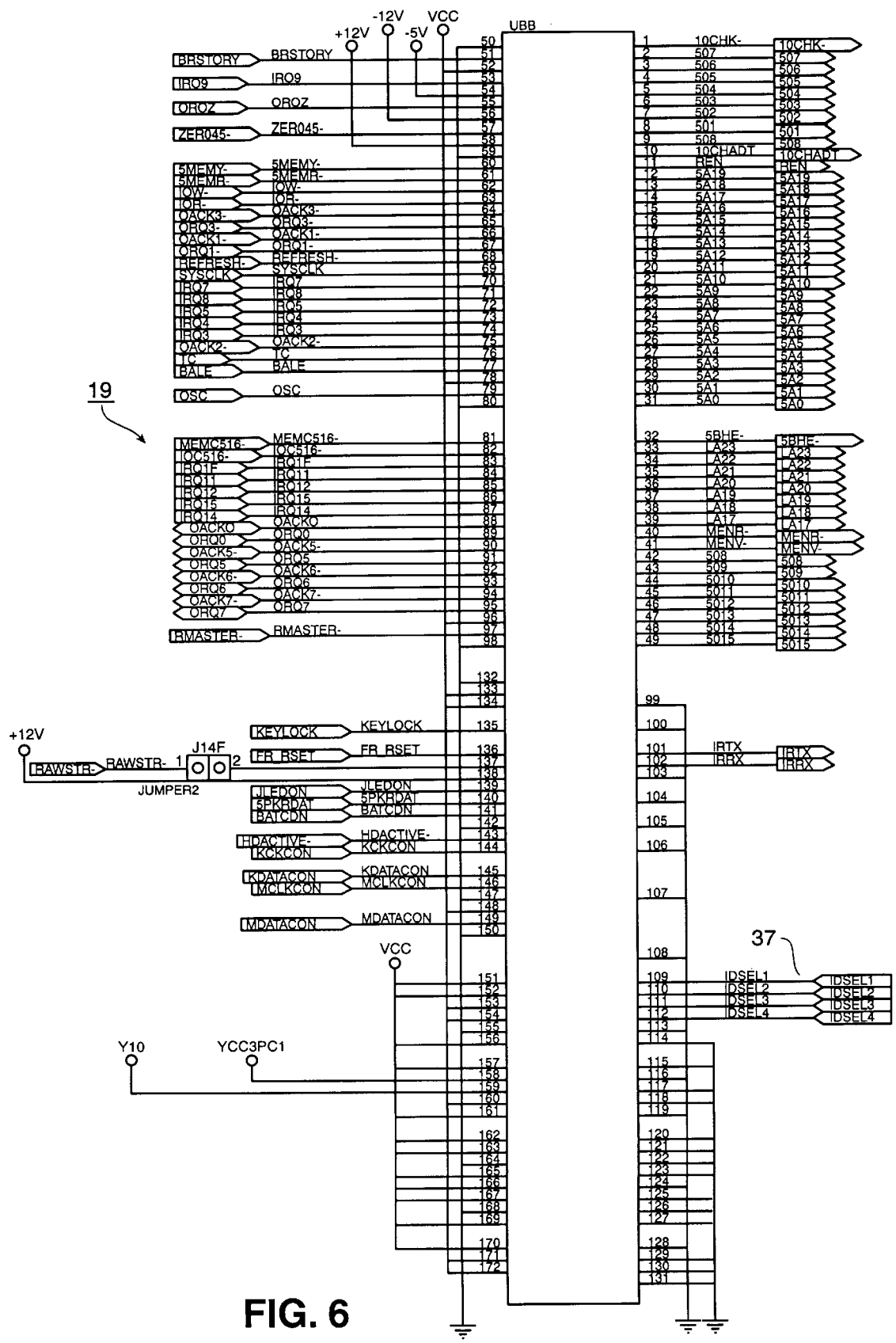
FIG. 6 shows pin assignments for the connector of the present invention.

Pin assignments for SBC connector 19 are shown in FIG. 6. As is clear to those skilled in the art, pins Nos. 1 to 98 comprise standard pin assignments for an ISA conneeter, whereas, pins Nos. 99 to 172 are not included in a standard ISA connector. Thus, the number of connections to VCC and ground are increased over that of a standard ISA connector. More specifically, in a standard ISA connector, there are only 3 connections to VCC and 4 connections to ground. As clearly shown in FIG. 6, in SBC connector 19, there are 23 connections to VCC (namely pins Nos. 52, 28, 92, 133, 134, 148, 151 to 154, 156, 157, 160, to 163, 165 to 167 and 169 to 172 and 38 connections to ground (namely pins Nos. 50, 59, 80, 98 to 100, 103 to 108, 113 to 132, 142, 147, 150, 155, 164 and 168).

As noted above, when SBC 17 is installed on passive backplane 16 by mating SBC connector 19 to SBC connector 22, there exists a potential difference between the ground on passive backplane 16 and that on SBC 17. The foregoing additional connections to VCC and ground reduce the potential difference between the ground on SBC 17 and that on passive backplane 16. In some cases, these additional ground and VCC connections reduce the ground potential difference to substantially zero. Since the ground potential difference causes data passed between SBC 17 and passive backplane 16 to be corrupted, this reduction in the ground potential difference reduces that data corruption.

At this point, it should be noted that FIG. 6 merely shows preferred VCC and ground pin assignments, and that other pin assignments are possible. In this regard, it has been found that addition of VCC pins in excess of 23 and addition of ground pins in excess of 38 does not significantly further reduce the foregoing ground potential difference. Therefore, the preferred amount of ground pins is 38 and the preferred amount of VCC pins is 23.

However, since the ground potential difference is affected by the number of connectors on passive backplane 16 and the processing speed of microprocessor 32 (i.e., the ground potential difference increases as the number of connectors and/or processing speed increases), it may be necessary to adjust these numbers accordingly. For example, as few as 14, or even fewer, VCC and ground pins could be included in a connector according to the present invention.

The remaining pin assignments shown in FIG. 6 are compatible with a standard ISA connector. These include at least one pin connected to −5V (e.g., pin No. 54), at least one pin connected to −12V (e.g., pin No. 56), and at least two pins connected to +12V (e.g., pins Nos. 58 and 138). Since these and other pin assignments on the top half of SBC connector 19 (i.e., pins Nos. 1 to 98) are well known to those of ordinary skill in the art, they are not described in detail herein.

Referring now to FIGS. 3 and 6, SBC connector 19 also includes pins 37, which have been assigned as bus select pins. Through these bus select pins and internal electrical wiring 39, SBC 17 can select (i.e., enable or disable) a particular bus by transmitting a bus select signal to its corresponding bus connector. For example, according to the present invention, SBC 17 can enable/disable bus 40 via bus select pin 41 (see FIG. 3). Once bus 40 has been enabled in this manner, SBC 17 can exchange information through bus 40 with another device (e.g., a mass storage device) also connected to bus 40. Likewise, SBC can prevent the exchange of information through bus 40 via bus select pin 41.

By selecting a bus in the foregoing manner, SBC connector 19 is able to select a bus even in cases where there are more than two bus connectors per SBC on passive backplane 16, without requiring additional physical components.

In the preferred embodiment of SBC connector 19 shown in FIG. 6, bus select pins 37 are assigned as pins.109 to 112. It should be noted, however, that these particular pin assignments are not required, and that any pin assignments may be utilized. Along these lines, it should also be noted that the invention is not limited to four bus select pins, nor are four bus select pins required. Rather the number of bus select pins required is generally dictated by the number of bus connectors in use on passive backplane 16. Likewise, the number of bus select lines is limited only by the number of available pins on SBC connector 19/SBC connector 22.

While the present invention has been described with respect to file server 1 having SBC 17 and passive backplane 16, it is noted that the invention is not limited to this environment. For example, the connector of the present invention could be incorporated into a slimline or a low profile chassis computer. Such computers include circuit boards that are connected to a motherboard via a riser card. In these arrangements, a ground potential difference as well as the need to provide bus select lines exists Thus, the connector of the present invention, i.e., that shown in FIG. 6, could be used to connect the riser card to the motherboard. The bus select pins included in the connector of the present invention would be used in the context of such a circuit board/motherboard combination. That is, an individual circuit board could select a bus on the motherboard using these bus select pins.

Likewise, the additional VCC and ground pins on the connector would operate in the manner described above to reduce a ground potential difference between the circuit boards and the motherboard, and thus the level of corruption in data exchanged between the circuit boards and the motherboard.

The invention can also be used with other computer hardware not described herein. In this regard, the invention has been described with respect to particular illustrative embodiments. It is to be understood that the invention is not limited to the above-described embodiments and that various changes may be made by those of ordinary skill in the art without departing from the spirit and scope of the invention.

What is claimed is:

1. A connector for a circuit board, the connector having pins which are compatible with a standard ISA connector, the connector comprising:

at least 38 pins connected to a ground potential;

at least 23 pins connected to a VCC potential; and a plurality of plural bus select pins, through which the circuit board can select a particular bus over which communications are transmitted to and from the circuit board.

2. A connector according to claim 1, wherein the at least 23 pins connected to the VCC potential and the at least 38 pins connected to the ground potential reduce, to substantially zero (0), a ground-potential difference between a passive backplane onto which the circuit board is installed and the circuit board, and there are four bus select pins, each for selecting one of four bus connectors.

3. A connector according to claim 1, further comprising plural additional pins which are compatible with a standard ISA connector.

4. A network file server which manages data received from a peripheral using a single board computer, the network file server comprising:

a network interface, over which data is transmitted to and received from a network;

a passive backplane comprising (1) a female board connector having a pin configuration which is compatible with a standard ISA connector, (2) one or more standard female ISA connectors, and (3) two or more bus connectors corresponding to buses over which data is transmitted;

one or more circuit boards having standard male ISA connectors mated to the standard female ISA connectors on the passive backplane; and a single board computer having a male board connector mated to the female board connector on the passive backplane, the mated board connectors having plural pins, at least 38 of the plural pins being connected to a ground potential, and at least 23 of the plural pins being connected to a VCC potential, the single board computer driving the circuit boards in the passive backplane so as to manage data received over the network interface or from other sources and to transmit that data over the buses.

5. A network file server according to claim 4, wherein the at least 23 pins connected to the VCC potential and the at least 38 pins connected to the ground potential reduce, to substantially zero (0), a ground potential difference between the passive backplane and the single board computer.

6. A network file server according to claim 4, wherein one of the bus connectors is associated with the board connector, and buses corresponding to the one bus connector connect to buses corresponding to others of the bus connectors.

7. A network file server according to claim 6, wherein the mated board connectors comprise one or more bus select pins which correspond to the others of the bus connectors, and the passive backplane further comprises an electrical connection between the one or more bus select pins and each corresponding other bus connector.

8. A network file server according to claim 6, wherein the buses comprise PCI buses.

9. A network file server according to claim 4, further comprising a fax/modem interface, over which the network file server receives data from one of the other sources.

10. A connector having a male half on a circuit board and a female half on a passive backplane, the connector mating the circuit board to the passive backplane, and having a pin configuration which is compatible with a standard ISA connector, the connector comprising:

between 14 and 38 pins connected to a ground potential;

between 14 and 23 pins connected to a VCC potential;

at least one pin connected to −5V;

at least one pin connected to −12V;

at least two pins connected to +12V; and four bus select pins, through which the circuit board can select a particular bus over which communications are transmitted to and from the circuit board.

* * * * *

UNITED STATES PATENT AND TRADEMARK OFFICE
CERTIFICATE OF CORRECTION

PATENT NO. : 5,922,059
DATED : July 13, 1999
INVENTOR(S) : Yu-Zong Lin, et al.

It is certified that error appears in the above-identified patent and that said Letters Patent is hereby corrected as shown below:

COLUMN 7

```
Line 52, "28, 92" should read --78, 96--;
Line 53, "160," should read --160--; and
Line 54, "172" should read --172)--.
```

Signed and Sealed this

Twenty-ninth Day of February, 2000

Attest:

Q. TODD DICKINSON

Attesting Officer

Commissioner of Patents and Trademarks